(12) United States Patent
Yamagishi et al.

(10) Patent No.: US 8,081,487 B2
(45) Date of Patent: Dec. 20, 2011

(54) SIGNAL TRANSMISSION CIRCUIT, IC PACKAGE, AND MOUNTING BOARD

(75) Inventors: Keitaro Yamagishi, Tokyo (JP); Seiichi Saito, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/195,851

(22) Filed: Aug. 21, 2008

(65) Prior Publication Data
US 2008/0315975 A1    Dec. 25, 2008

Related U.S. Application Data

(62) Division of application No. 11/359,510, filed on Feb. 23, 2006, now Pat. No. 7,501,910.

(30) Foreign Application Priority Data

Feb. 25, 2005 (JP) ................... 2005-051515
Feb. 22, 2006 (JP) ................... 2006-045521

(51) Int. Cl.
    *H05K 1/18* (2006.01)
(52) U.S. Cl. .............. 361/778; 333/236.7; 333/243; 333/22 R
(58) Field of Classification Search ............ 361/778; 333/257, 236.7, 243, 22 R
    See application file for complete search history.

(56) References Cited

U.S. PATENT DOCUMENTS

| 6,172,539 B1 * | 1/2001 | Tagishi ..................... 327/141 |
| 6,208,161 B1 * | 3/2001 | Suda ........................ 326/30 |
| 6,490,325 B1 * | 12/2002 | Fiedler et al. ............. 375/257 |
| 7,501,910 B2 * | 3/2009 | Yamagishi et al. ......... 333/22 R |
| 2001/0040471 A1 * | 11/2001 | Urakawa ...................... 327/112 |
| 2007/0127404 A1 * | 6/2007 | Best ............................ 370/314 |

FOREIGN PATENT DOCUMENTS

JP    8-297924 A    11/1996

OTHER PUBLICATIONS

Yamagishi et al., IEEE 14th, Topical Meeting Electrical Performance of Electronic PAckaging (EPEP), Oct. 2005, pp. 209-212.

* cited by examiner

*Primary Examiner* — Yuriy Semenenko
*Assistant Examiner* — Andargie M Aychillhum
(74) *Attorney, Agent, or Firm* — Birch, Stewart, Kolasch & Birch, LLP (57) ABSTRACT

Provided is a signal transmission circuit capable of realizing the same effects as those in a conventional manner that employs a complicated circuit by using no complicated circuit, that is, by a simple circuit. The signal transmission circuit includes: a transmission path having a first impedance; a terminating resistor having a predetermined resistance; a transmission path having a second impedance, which is connected to the transmission path and the terminating resistor, the second impedance being higher than both of the first impedance and the predetermined resistance; and an input buffer for receiving a signal at a connection portion of the transmission path and the transmission path.

6 Claims, 6 Drawing Sheets

SIGNAL TRANSMISSION CIRCUIT, IC PACKAGE, AND MOUNTING BOARD

This application is a Divisional of application Ser. No. 11/359,510 filed on Feb. 23, 2006, now U.S. Pat. No. 7,501,910, and for which priority is claimed under 35 U.S.C. §120; and this application claims priority of Application No. 2005-051515 filed in Japan on Feb. 25, 2005 and Application No. 2006-045521 filed in Japan on Feb. 22, 2006 under 35 U.S.C. §119; the entire contents of all are hereby incorporated by reference.

BACKGROUND OF THE INVENTION

1. Field of the Invention

The present invention relates to a signal transmission circuit used for an information processing device or the like which transmits a serial signal at a high speed, and to an IC package and a mounting substrate.

2. Description of the Related Art

A conventional signal transmission circuit reduces jitter with the use of, for example, an equalizer (for example, refer to JP 08-297924 A).

A frequency dependency of the loss of a passive equalizer is a frequency dependency lost reverse to the loss of a transmission path, and the loss of the total pass characteristics is kept substantially constant regardless of the frequency. For that reason, the receive waveform of a receiver IC (integrated circuit) has substantially the same amplitude in any bits, and the jitter of its eye pattern is reduced. Because the total frequency components are uniformly attenuated, the eye opening amplitude becomes small. However, the conventional circuit that reduces jitter by using the passive equalizer is configured by a circuit that includes elements such as an inductance, a resistor, and a capacitor. Therefore, forming such a circuit within an IC leads to a problem in that an IC process is complicated, and forming the circuit on a substrate in the form of chip parts leads to a problem in that the number of parts and the mounted area are increased.

Also, since the gain of an active equalizer has the characteristic that compensates the loss of a transmission path, the total pass characteristics are small in the loss over the total frequencies. For that reason, the receive waveform of the receiver IC is substantially the same as the output waveform of a driver IC (integrated circuit), and its eye pattern is reduced in the jitter and large in the opening amplitude. However, the conventional circuit that reduces the jitter by using the active equalizer uses a dedicated IC, or its function is integrated in the receiver IC. The use of the dedicated IC adversely increases the number of parts and the costs. In the case where the function is integrated in the receiver IC, not only the complicated IC, the increased IC area, the microscopic IC manufacturing process, and the resultant increased IC costs are caused, but also the waveform that has passed through the active equalizer cannot be observed from the external. In addition, either case leads to a problem in that the power consumption is remarkably increased in order to obtain the gain.

In addition, the output waveform of the driver IC which has been subjected to pre-emphasis is larger in the amplitude than the normal output waveform in only the bits immediately after being inverted. For that reason, the eye pattern of the output waveform of the driver IC has two kinds of levels in both of high and low. When the output waveform is attenuated in the high frequency component due to the loss of the transmission path, the receive waveform of the receiver IC becomes original level in all of the bits, and its eye pattern is small in jitter, bringing the opening amplitudes to a small level. The output waveform of the drive IC which has been subjected to de-emphasis has a normal amplitude in only the bits immediately after being inverted, and in the case of the same data as previous data, the amplitude is made small. For that reason, the eye pattern of the output waveform of the driver IC has two kinds of levels in both of high and low. When the output waveform is attenuated in the high frequency component due to the loss of the transmission path, the receive waveform of the receiver IC becomes small amplitude level in all of the bits, and its eye pattern is small in jitter, bringing the opening amplitudes to a small level. However, the conventional circuit that reduces the jitter by using pre-emphasis or de-emphasis requires a comparator circuit for comparing data of two continuous bits, and in the case where data is continuous, a control circuit that changes the amplitude of a first bit or a second bit, as a driver IC output, and a power circuit that changes the voltage across an output transistor. This configuration leads to a problem in that the complicated IC, the increased IC area, the microscopic IC manufacturing process, and the resultant increased IC costs are caused.

SUMMARY OF THE INVENTION

The present invention has been made to solve the above-mentioned problems, and therefore an object of the present invention is to provide a signal transmission circuit which is capable of realizing the same effects as those in the conventional manner that employs the complicated circuit by using no complicated circuit, that is, by a simple circuit.

According to the present invention, there is provided a signal transmission circuit, including: a first transmission path having a first impedance; a terminating resistor having a predetermined resistance; and a second transmission path having a second impedance, which is connected to the first transmission path and the terminating resistor, the second impedance being higher than both of the first impedance and the predetermined resistance, in which a signal is received at a connection portion of the first and second transmission paths.

The signal transmission circuit according to the present invention is advantageous in that the signal transmission circuit is capable of realizing the same effects as those in the conventional manner that employs the complicated circuit by using no complicated circuit, that is, by a simple circuit.

DETAILED DESCRIPTION OF THE PREFERRED EMBODIMENTS

Now, a description will be given in more detail of preferred embodiments of the present invention with reference to the accompanying drawings.

First Embodiment

Figure 1:
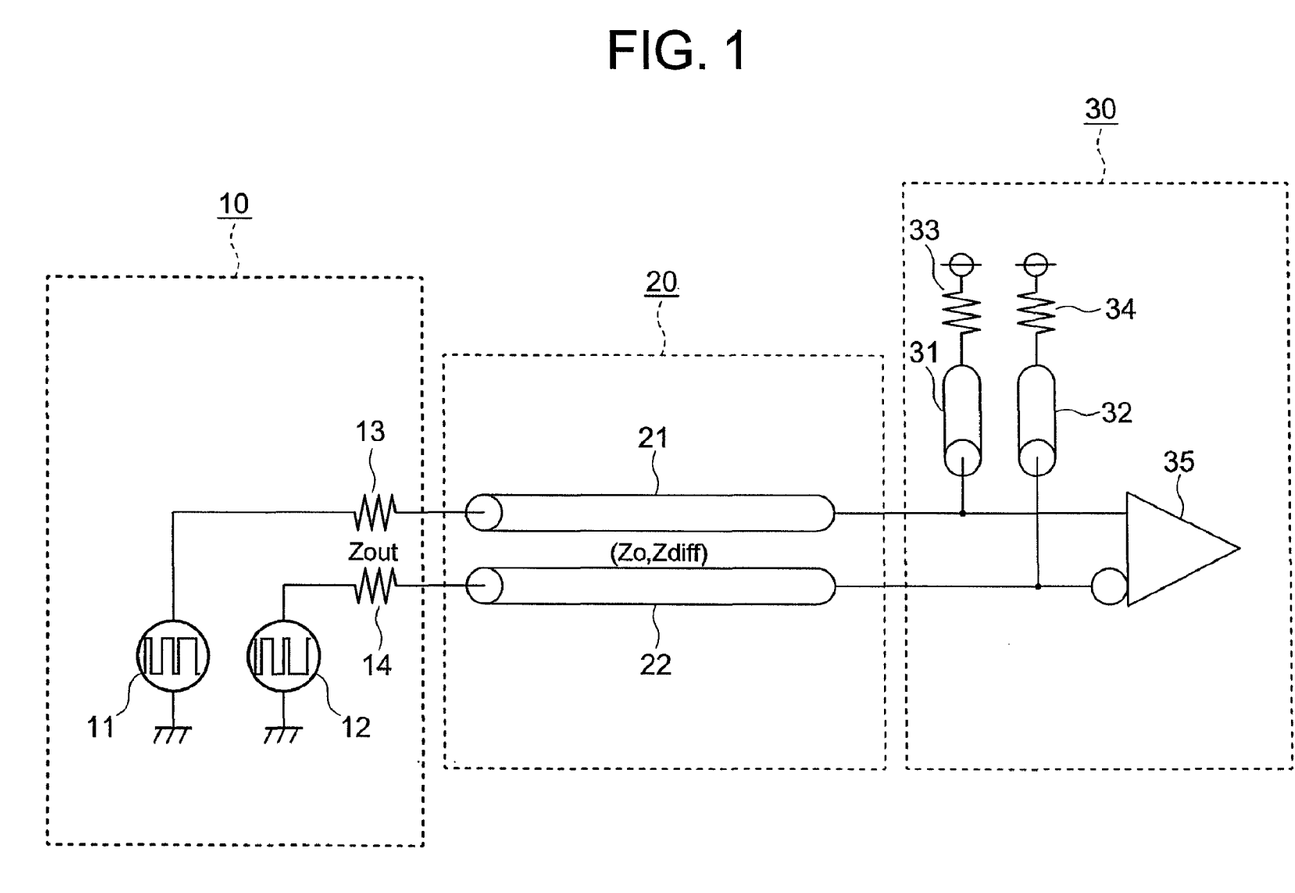
FIG. 1 is a diagram showing an equivalent circuit of a structure of a signal transmission circuit according to a first embodiment of the present invention.

A signal transmission circuit according to a first embodiment of the present invention will be described with reference to FIGS. 1 and 2. FIG. 1 is a diagram showing an equivalent circuit of a structure of a signal transmission circuit according to the first embodiment of the present invention. In the respective drawings, the identical symbols denote like parts.

In FIG. 1, the signal transmission circuit according to the first embodiment includes a signal output equivalent circuit 10, a transmission path 20, and a signal receiver equivalent circuit 30.

The signal output equivalent circuit 10 includes a data signal source 11, an inversion data signal source 12, an output impedance 13 of a data signal, and an output impedance 14 of an inversion data signal.

The transmission path 20 is made up of a transmission path 21 of a data signal, and a transmission path 22 of an inversion data signal.

The signal receiver equivalent circuit 30 is made up of a high impedance transmission path 31 that is connected to the transmission path 21 of the data signal, a high impedance transmission path 32 that is connected to the transmission path 22 of the inversion data signal, a terminating resistor 33 of the data signal, a terminating resistor 34 of the inversion data signal, and an input buffer 35.

In other words, the transmission paths 31 and 32 that are high in the characteristic impedance are connected between the transmission paths 21, 22 and the terminating resistors 33, 34, respectively.

Then, the operation of the signal transmission circuit according to the first embodiment will be described with reference to the drawings.

First, a signal waveform will be described. The data signal source 11 and the inversion data signal source 12 are always reversed in phase. Signals that are outputted from the signal sources 11 and 12 pass through the transmission paths 21 and 22 having the frequency dependent loss, and reach the input buffer 35. However, in this situation, the inconsistencies between the transmission paths 21 and 22 and the high impedance transmission paths 31 and 32, that is, the characteristic impedance of the latter is higher than that of the former, with the result that there occurs positive reflection to increase the amplitude.

The waveforms that have been increased in the amplitude are transmitted toward the terminating resistors 33 and 34, and then negative reflection occurs because of the inconsistencies between the high impedance transmission paths 31 and 32 and the terminating resistors 33 and 34, that is, because the characteristic impedance of the former is higher than the resistance of the latter.

The negative reflection waveforms are returned to the high impedance transmission paths 31 and 32, and reach connection portions between the high impedance transmission paths 31 and 32 and the input buffer 35, respectively. At this time, second negative reflection for first negative reflection which means positive waveform, occurs. So the first negative reflection waveform returning from the terminating resistors 33 and 34 and this positive waveform are superposed at the position where the input buffer 35 and the high impedance transmission paths 31 and 32 are connected. For that reason, the waveforms that are received by the input buffer 35 first become higher in the amplitude than the original amplitude, and thereafter become slightly higher in the amplitude than the original amplitude in the case where the characteristic impedances of the transmission paths 21 and 22 are close to the resistors of the terminating resistors 33 and 34 due to the negative reflection that are returned from the terminating resistors 33 and 34.

The edges of the waveforms become precipitous due to the heightened amplitude, and the high frequency components of the received waveforms that are attenuated due to the losses of the transmission paths 21 and 22 are increased. As a result, the jitter of the eye pattern is reduced, and the opening amplitude is increased. Also, the level of the waveforms is immediately returned to the original due to the negative reflection.

In the case where the resistances of the terminating resistors 33 and 34 are the same as the characteristic impedances of the high impedance transmission paths 31 and 32, the eye pattern of the input buffer 35 is not reduced in the jitter.

When the characteristic impedances of the high impedance transmission paths 31 and 32 are higher than both of the characteristic impedances of the transmission paths 21 and 22 and the resistors of the terminating resistors 33 and 34, the jitter of the eye pattern in the input buffer 35 is reduced, and the eye opening amplitude is increased.

FIGS. 2A to 2F are graphs showing waveform simulation results in the case a signal of 4 Gbps is transmitted to an FR-4 substrate wiring that is about 60 cm in the length as a specific example of the signal transmission circuit shown in FIG. 1.

Figure 2A:
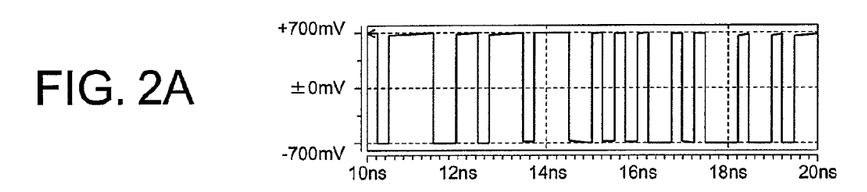
FIGS. 2A to 2F are graphs showing the signal waveforms of a specific example of the signal transmission circuit according to the first embodiment of the present invention.
Figure 2B:
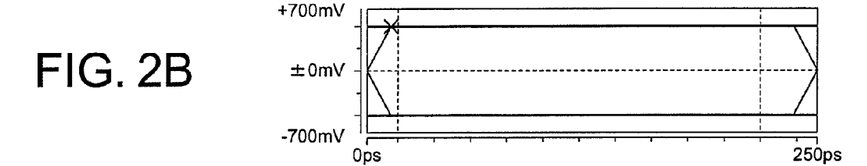
Figure 2C:
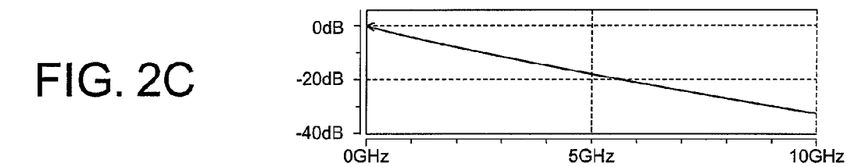
Figure 2D:
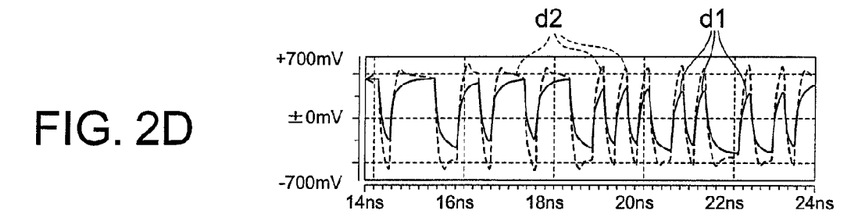
Figure 2E:
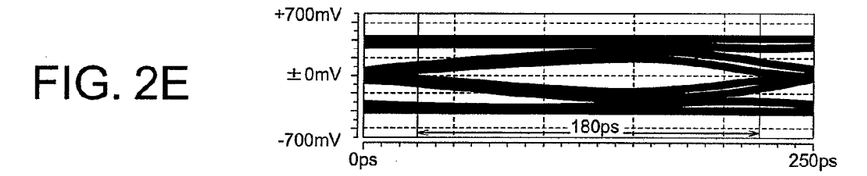
Figure 2F:
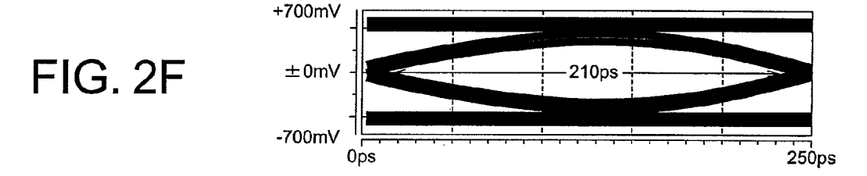

FIG. 2A shows an output differential waveform of the signal output equivalent circuit 10 in the case of no high impedance transmission paths 31 and 32, FIG. 2B is an eye pattern of the output differential waveform of the signal output equivalent circuit 10 in the case of no high impedance transmission paths 31 and 32, FIG. 2C is pass characteristics of wirings (transmission paths 21 and 22), FIG. 2D is received differential waveforms of the input buffer 35 in the case where there is no high impedance transmission paths 31 and 32, and in the case where there are the high impedance transmission paths 31 and 32, FIG. 2E is the eye pattern of the received differential waveform of the input buffer 35 in the case where there are no high impedance transmission paths 31 and 32, and FIG. 2F is the eye pattern of the received differential waveform of the input buffer 35 in the case where there are the high impedance transmission paths 31 and 32. In FIG. 2D, a symbol d1 is the received differential waveform (solid line) of the input buffer 35 in the case where there is no high impedance transmission paths 31 and 32, and d2 is the received differential waveform (dotted line) of the input buffer 35 in the case where there are the high impedance transmission paths 31 and 32.

The simulation conditions will be described. The output impedances 13 and 14 (Zout) are 50 Ω, the characteristic impedances (Zo) of the wirings (transmission paths 21 and 22) are 50 Ω, and the terminating resistors 33 and 34 are also 50%. The impedance matching is completely conducted in the case where there is no high impedance transmission path. The high impedance transmission paths 31 and 32 have the characteristic impedance $Zo=150$ Ω and the delay time $Td=125$ ps. The signal speed is 4 Gbps, and a time of 1 bit is 250 ps. A unit obtained by standardizing the real time by a time of one bit is called "UI (unit interval)", for example, in the case of 4 Gbps, 250 ps is 1 UI, and 50 ps is 0.2 UI.

First, the waveforms in the case where there are no high impedance transmission paths 31 and 32 will be described. Because the impedance is matched, as shown in FIG. 2B, the eye pattern of the output differential waveform of the signal output equivalent circuit 10 hardly has the jitter. However, the transmitted signal is more attenuated due to the frequency dependent loss that appears in the pass characteristics of the wirings shown in FIG. 2C as the frequency component is higher, and as shown in FIG. 2E, the opening width of the eye pattern that is received by the input buffer 35 is about 180 ps, and the jitter of about 70 ps exists. The time 70 ps corresponds to the time 0.28 UI in the case of 4 Gbps.

Subsequently, the waveform improvement effects obtained by the high impedance transmission paths 31 and 32 will be described. The reflected waves of +50% are generated with respect to the amplitude due to the mismatching with the FR-4 substrate wiring, and the amplitude is 1.5 times of the amplitude of waveform firstly transmitted. In the mismatching with the terminating resistors 33 and 34, the reflected wave of −50% is generated with respect to the amplitude which is originally 1.5 times. When the reflection waveform returns to the portion where the input buffer 35 is connected, another reflection waveform of +37.5% of the firstly transmitted waveform is generated. Since a delay time Td of the high impedance transmission paths 31 and 32 is 125 ps, the reciprocation 250 ps is 1 UI.

In other words, the waveform that is taken by the input buffer 35 is 1.5 times of the original at the time where the signal first reaches the input buffer 35, and becomes 1.125 times after 1 UI has elapsed. As a result, only the bits of the signal that has been inverted becomes 1.5 times with respect to the waveforms in the case where there are no high impedance transmission paths 31 and 32. In the case where the bits that have been inverted are the same data, the second bit has the amplitude of 1.125 times, and the subsequent bits gradually approach the original amplitude. As a result, the opening width of the eye pattern is recovered up to about 210 ps, and the jitter is reduced to 40 ps, with the result that the eye opening is spread from about ±100 mV to about ±250 mV.

In other words, in the first embodiment, the additional high impedance transmission paths 31 and 32 which are higher in the characteristic impedance than both of the characteristic impedances of the transmission paths 21 and 22 and the resistances of the terminating resistors 33 and 34 are disposed between the transmission paths 21 and 22 and the terminating resistors 33 and 34, and the signal is received by the connecting portion of the original transmission paths 21 and 22 and the added high impedance transmission paths 31 and 32.

Also, the impedances of the added high impedance transmission paths 31 and 32 are 1.1 to 4 times of the impedances of the transmission paths 21 and 22. The high impedance transmission paths 31 and 32 have lengths corresponding to the delay time which is in a range of 0.1 to 2 times of the cycle of the data signal operating frequency.

As described above, in the first embodiment, it is possible to reduce the jitter of the eye pattern and broaden the eye opening with respect to the transmission path corresponding to the FR-4 substrate wiring 60 cm even if the function of an IC such as a passive equalizer, an active equalizer, pre-emphasis, or de-emphasis is not used.

Second Embodiment

Figure 3:
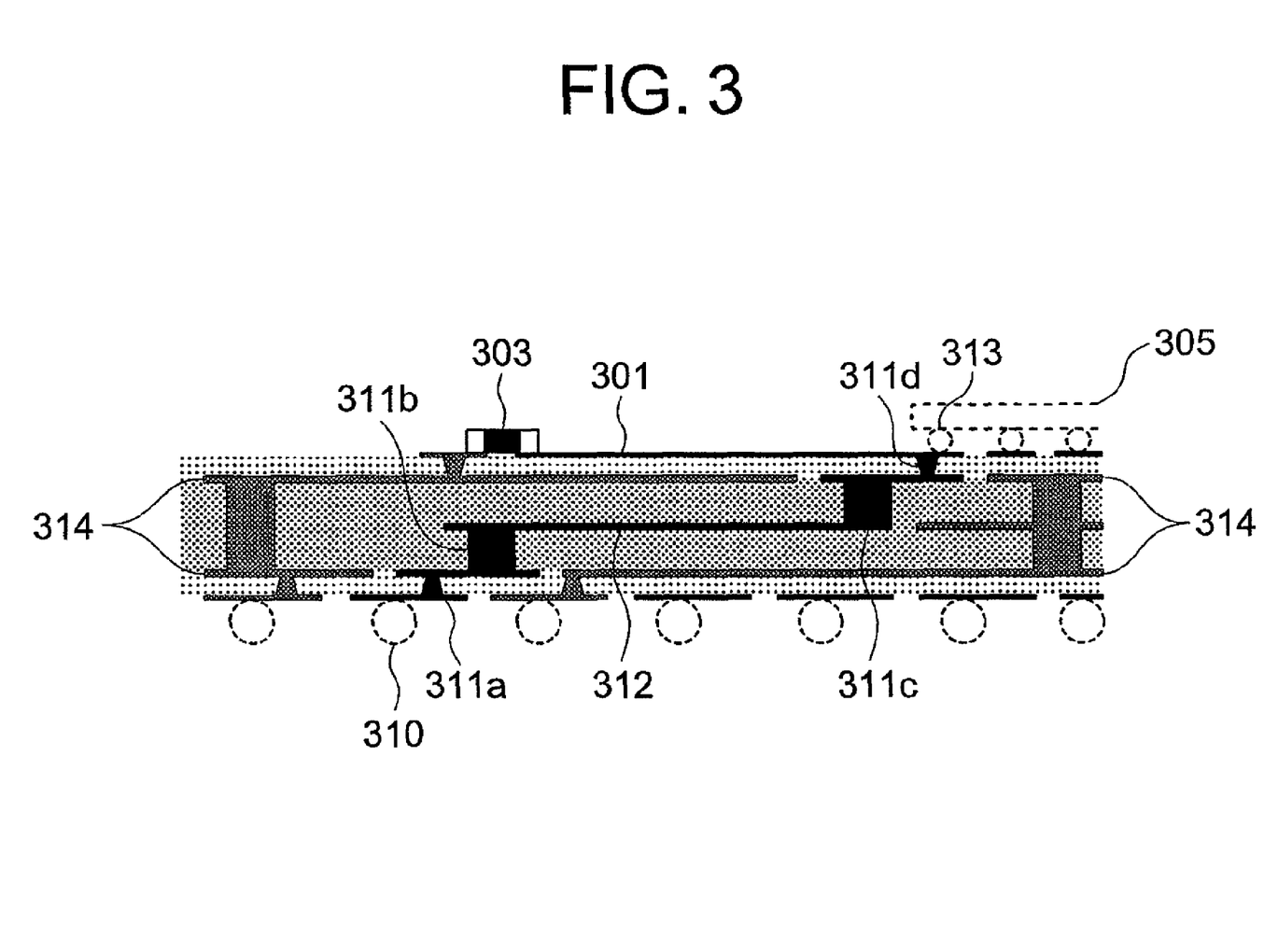
FIG. 3 is a partially cross-sectional view showing a receiver IC package of a structure of a signal transmission circuit according to a second embodiment of the present invention.

A signal transmission circuit according to a second embodiment of the present invention will be described with reference to FIG. 3. FIG. 3 is a partially cross-sectional view showing a structure of a signal transmission circuit in a receiver IC package according to the second embodiment of the present invention. FIG. 3 shows an example of forming a high impedance transmission path in the form of package substrate wiring.

In FIG. 3, the signal transmission circuit according to the second embodiment, the signal transmission circuit according to the second embodiment includes a package substrate wiring 301 having a high impedance which is formed on the package substrate surface, a terminating resistor 303 such as a chip resistor which is mounted on the package substrate surface, a receiver IC (receiver circuit) chip 305, and a package substrate wiring 312 that forms a part of the transmission path. The receiver IC described in the present specification includes an IC having both terminals for signal reception and transmission. In this case, the receiver IC refers to a receiver portion.

The package substrate wiring 312 passes through vias 311b and 311a, and a solder ball 310 that is formed on a package substrate rear surface, and is connected to a driver IC (not shown) through a mounting substrate wiring. Also, the package substrate wiring 312 passes through vias 311c and 311d and a solder bump 313, and is connected to the receiver IC 305. A ground GND 314 of the package substrate is represented by gray.

Subsequently, the operation of the signal transmission circuit according to the second embodiment will be described with reference to the accompanying drawings.

A signal that is outputted from the driver IC reaches the package of the receiver IC through the mounting substrate wiring, and passes through the package substrate wiring 312 via the solder ball 310 and the vias 311a and 311b. Then, the signal is inputted to the receiver IC 305 through vias 311c and 311d and the solder bump 313.

The wiring 301 is drawn on the package substrate surface immediately below the solder bump 313 that connects the package substrate and the receiver IC 305, and a leading edge of the wiring 301 is connected to the terminating resistor 303. The characteristic impedance of the additional package substrate wiring 301 is set to be higher than the characteristic impedance of the package substrate wiring 312 that is a transmission path and the resistance of the terminating resistor 303, and the package substrate wiring 301 is set to a wiring length for realizing a wiring delay time. This leads to the occurrence of a positive reflection due to the mismatching of the package substrate wiring 312 and the additional package substrate wiring 301, and a negative reflection due to the mismatching of the additional package substrate wiring 301 and the terminating resistor 303.

As described above, in the second embodiment, a desired circuit can be simply realized. In addition, in the second embodiment, because the terminating resistor 303 is put on the package substrate surface, a resistor that is formed on the interior of the receiver IC 305 is generally unnecessary.

In the second embodiment, the terminating resistor 303 is a chip resistor. However, the chip resistor may be replaced by a package substrate built-in resistor. Alternatively, the terminating resistor 303 may be connected to the terminating resistor within the receiver IC 305 through another solder bump of the receiver IC 305. Also, the high impedance wiring 301 may be an in-layer wiring if the high characteristic impedance is kept.

Third Embodiment

Figure 4:
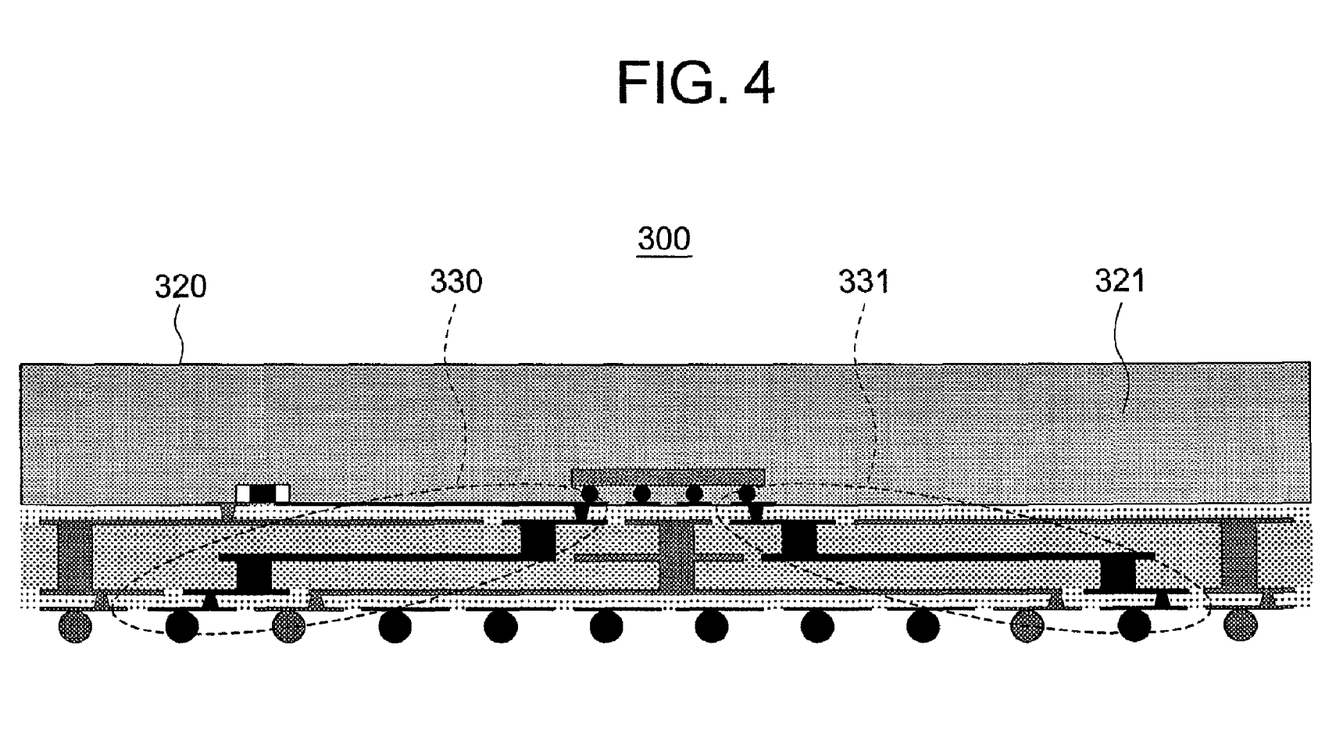
FIG. 4 is a cross-sectional view showing a receiver IC package of a signal transmission circuit according to a third embodiment of the present invention.

A signal transmission circuit according to a third embodiment of the present invention will be described with reference to FIG. 4. FIG. 4 is a cross-sectional view showing an IC package of the signal transmission circuit according to the third embodiment. FIG. 4 shows an example of the IC package using the package substrate according to the second embodiment.

Referring to FIG. 4, the IC package 300 includes a package case 320, a filler 321 within the package case 320, a reception signal transmission path 330, and a transmitting signal transmission path 331.

Subsequently, the operation of the signal transmission circuit according to the third embodiment will be described with reference to the drawings.

The additional package substrate wiring 301 and the terminating resistor 303 that are described above in the second embodiment are disposed in the reception signal transmission path 330. However, since the transmitting signal transmission path 331 does not require such a provision, the transmission signal transmission path 331 are merely connected to four vias and the package substrate wiring between the solder bump and the solder ball.

The use of the IC package 300 widens an eye pattern that is actually detected by the IC even if the opening degree of the eye pattern of the waveform at the receive pin (solder ball) of the package substrate rear surface on which the IC is mounted is small.

As described above, the use of the package substrate in which the high impedance wiring is inserted between the package substrate wiring and the terminating resistor makes it possible to provide an IC package that is high in the jitter resistance at the receive pins (solder balls) since the eye pattern that has been deteriorated in the mounting substrate wiring (not shown) is restored.

Fourth Embodiment

Figure 5:
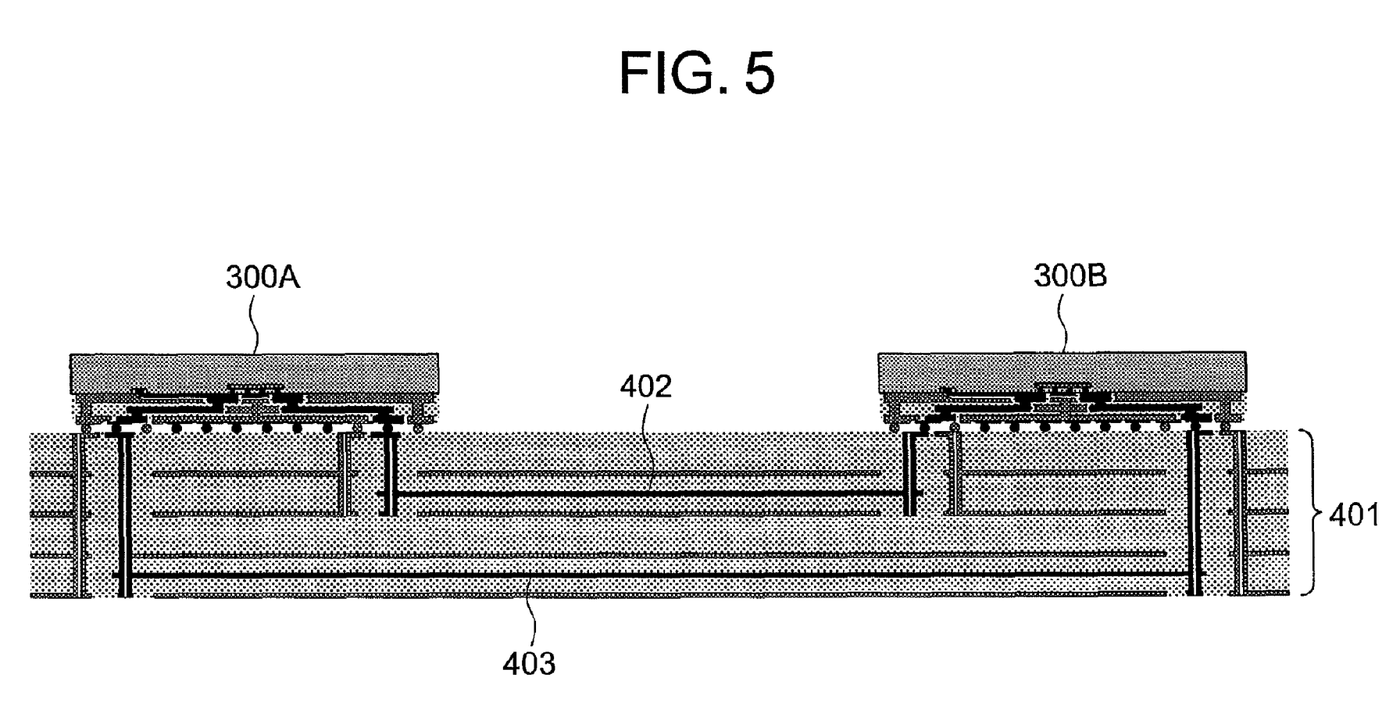
FIG. 5 is a cross-sectional view showing a mounting substrate on which a receiver IC package of a signal transmission circuit is mounted according to a fourth embodiment of the present invention.

A signal transmission circuit according to a fourth embodiment of the present invention will be described with reference to FIG. 5. FIG. 5 is a cross-sectional view of a mounting substrate on which the IC package of the signal transmission circuit according to the fourth embodiment of the present invention is mounted.

Referring to FIG. 5, disposed on a mounting substrate 401 are: disposed an IC package 300A having transmit and receive pins, which are mounted on the substrate surface; an IC package 300B having transmit and receive pins, which is mounted on the substrate surface likewise; a mounting substrate wiring 402 from a left-side IC package 300A to a right-side IC package 300B; and a mounting substrate wiring 403 extending from the right IC package 300B to the left IC package 300A. Those IC packages 300A and 300B are the same as the IC package 300 of the above third embodiment.

Subsequently, the operation of the signal transmission circuit according to the fourth embodiment will be described with reference to the drawings.

In the case where the wiring of the mounting substrate 401 is used as a transmission path, the loss of the frequency dependency becomes large due to the conductor loss and the dielectric loss of the mounting substrate 401 with the result that the eye pattern is liable to be broken. However, those two IC packages 300A and 300B produce the high impedance on the package substrate, and terminate their leading edges with the result that the jitter of the eye pattern and the eye opening amplitude are improved.

As describe above, since the package substrate in which the high impedance wiring is inserted between the package substrate wiring and the terminating resistor is used, the user of the IC package can use the signal transmission circuit assuming that the eye pattern that is deteriorated by the mounting substrate wiring is restored. As a result, the signal transmission circuit can be used even in a system having a transmission path in which the eye pattern is more broken.

Fifth Embodiment

Figure 6:
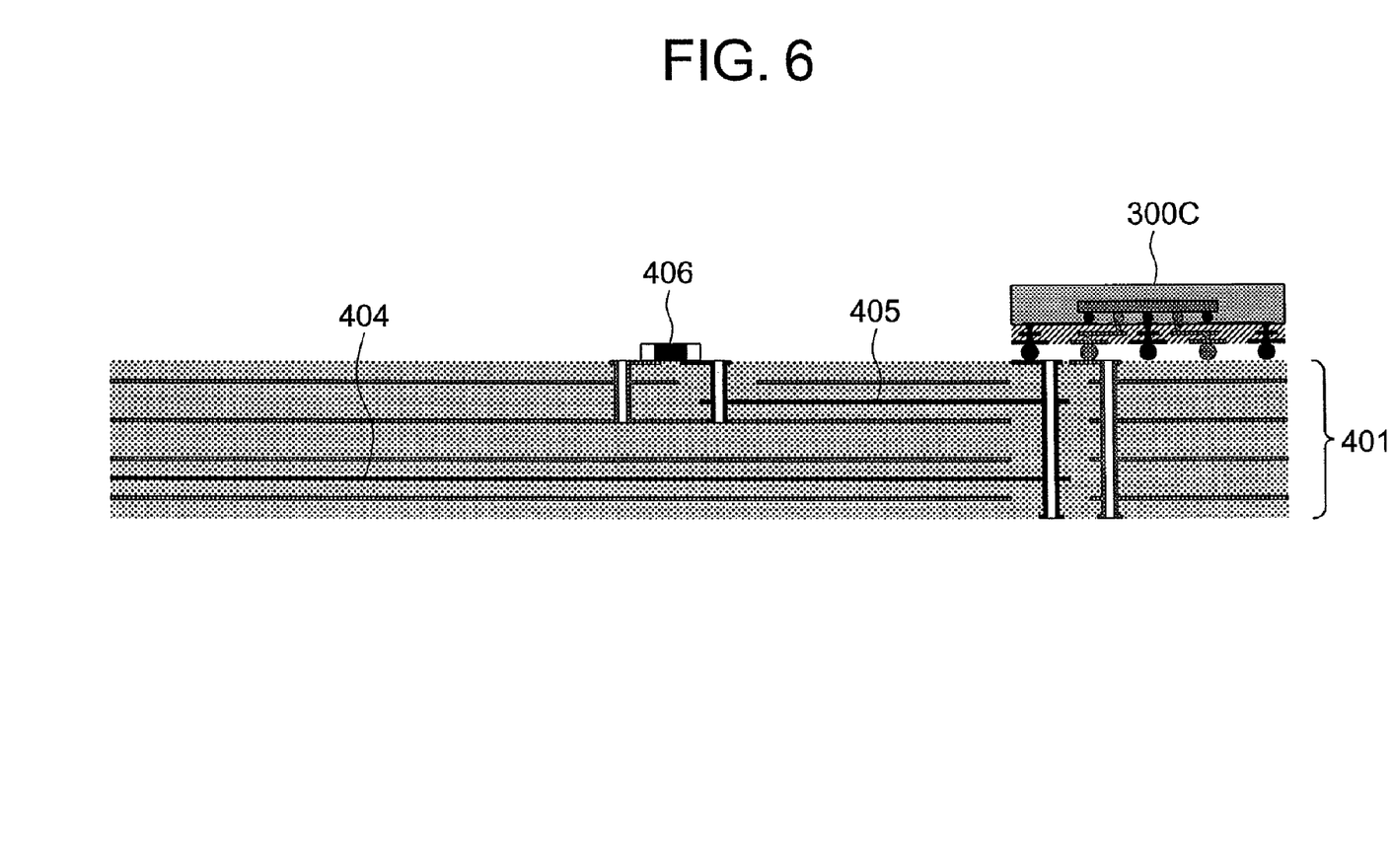
FIG. 6 is a cross-sectional view showing a mounting substrate of the structure of a signal transmission circuit according to a fifth embodiment of the present invention.

A signal transmission circuit according to a fifth embodiment of the present invention will be described with reference to FIG. 6. FIG. 6 is a cross-sectional view showing a mounting substrate of a structure of the signal transmission circuit according to the fifth embodiment of the present invention. FIG. 6 shows an example of forming a high impedance transmission path in the form of mounting substrate wiring.

Referring to FIG. 6, the signal transmission circuit according to the fifth embodiment includes a mounting substrate wiring 404 that is formed in the interior of the mounting substrate 401, a high impedance wiring 405 that is an additional mounting substrate wiring which is formed in the interior of the mounting substrate 401, a receiver IC package 300C that is mounted on the surface of the mounting substrate 401, and a terminating resistor 406 that is formed on the surface of the mounting substrate 401.

The characteristic impedance of the high impedance wiring 405 is set to be higher than the characteristic impedance of the mounting substrate wiring 404 that is a transmission path and the resistance of the terminating resistor 406, and the high impedance wiring 405 is set to a wiring length for realizing a desired wiring delay time.

Subsequently, the operation of the signal transmission circuit according to the fifth embodiment will be described with reference to the drawing.

The transmission path that is formed on the wiring 404 of the mounting substrate 401 has the loss of the frequency dependency, and the jitter of the eye pattern is increased until reaching the receiver IC package 300C with the eye opening amplitude becoming smaller. However, the terminating resistor 406 is put on the mounting substrate 401 surface, and the high impedance wiring 405 is connected between the terminating resistor 406 and the receiver IC package 300C with the results that there occur the positive reflection due to the mismatching of the mounting substrate wiring 404 and the high impedance wiring 405, and the negative reflection due to the mismatching of the high impedance wiring 405 and the terminating resistor 406. Then, the eye pattern at the receiver IC package 300C is reduced, the eye opening is broadened with the eye opening amplitude becoming larger.

As described above, in the fifth embodiment, a desired circuit can be simply realized. In addition, in the fifth embodiment, because the terminating resistor 406 is put on the mounting substrate 401, the resistor that is formed in the interior of the receiver IC chip is generally unnecessary.

In the case where the wiring within the receiver IC package is short with respect to the signal speed, an influence on the waveform improvement is small and can be ignored. Also, in the fifth embodiment, the terminating resistor 406 can be realized by the chip resistor that is mounted on the surface of the mounting substrate 401. Alternatively, the terminating resistor 406 may be embedded in the interior of the mounting substrate 401. Also, the terminating resistor 406 may be formed of a resistor that is formed in the substrate manufacturing process of the mounting substrate 401. In addition, it is possible that the terminating resistor 406 is formed in the IC chip and is connected to the IC chip from another terminal through the IC package 300C. Also, the high impedance wiring 405 may be formed of a surface layer wiring of the mounting substrate 401.

What is claimed is:

1. A signal transmission circuit, comprising:
a first transmission path having a first impedance;
a terminating resistor having a predetermined resistance and electrically connected on one end only to a second transmission path and on another end only to ground; and
said second transmission path having a second impedance, one end of which is connected to the first transmission path, other end of which is connected to the terminating resistor, the second impedance being higher than both of the first impedance and the predetermined resistance,
wherein the second transmission path is formed by using a substrate wiring of a specified length such that it creates a wiring delay so as to provide a positive reflection between the first and second transmission paths and a negative reflection between the second transmission path and the terminating resistor, and
wherein a signal is received at a connection portion of the first transmission path and the second transmission path.

2. An IC package having the signal transmission circuit according to claim 1.

3. An IC package, comprising:
a reception signal transmission path for receiving a signal from an external; and
a transmitting signal transmission path for transmitting the signal to the external,
wherein the reception signal transmission path comprises:
a first package substrate wiring having a first impedance which is formed in the interior of the package substrate;
a terminating resistor having a predetermined resistance which is formed on the surface of the package substrate; and
a second package substrate wiring which is formed on the package substrate surface, one end of which is connected to the first package substrate wiring, the other end of which is connected to the terminating resistor, the second impedance being higher than both of the first impedance and the predetermined resistance,
wherein the transmitting signal transmission path includes a third package substrate wiring that is formed in the interior of the package substrate,
the IC package further comprising a receiver circuit that receives a signal at a connection portion of the first and second package substrate wirings, and transmits the signal to the third package substrate wiring.

4. A mounting substrate on which the second IC package according to claim 2 or 3 is mounted, the mounting substrate comprising a mounting substrate wiring for connecting a transmitting signal terminal of the first IC package and a reception signal terminal of the second IC package.

5. A signal transmission circuit, comprising:
a first mounting substrate wiring having a first impedance which is provided to a mounting substrate;
a terminating resistor having a predetermined resistance which is provided to the mounting substrate; and
a second mounting substrate wiring having a second impedance which is provided to the mounting substrate, one end of which is connected to the first transmission path, the other end of which is connected to the terminating resistor, the second impedance being higher than both of the first impedance and the predetermined resistance,
wherein a signal is received at a connection portion of the first mounting substrate wiring and the second mounting substrate wiring.

6. A mounting substrate having the signal transmission circuit according to claim 5.

* * * * *